United States Patent
Hsu et al.

(10) Patent No.: US 7,730,443 B2
(45) Date of Patent: Jun. 1, 2010

(54) SYSTEM AND METHOD FOR CHECKING A LENGTH OF A WIRE PATH BETWEEN A CAPACITOR AND A VIA OF A PCB DESIGN

(75) Inventors: Shou-Kuo Hsu, Taipei Hsien (TW); Chun-Shan Hsiao, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 281 days.

(21) Appl. No.: 11/951,284

(22) Filed: Dec. 5, 2007

(65) Prior Publication Data
US 2008/0189669 A1    Aug. 7, 2008

(30) Foreign Application Priority Data
Feb. 2, 2007    (CN) .................. 2007 1 0200152

(51) Int. Cl.
*G06F 17/50* (2006.01)
*G06F 9/45* (2006.01)
(52) U.S. Cl. .................. 716/15; 716/5; 716/11
(58) Field of Classification Search ............ 716/15, 716/5, 11
See application file for complete search history.

(56) References Cited

U.S. PATENT DOCUMENTS 7,168,058 B2    1/2007    Harada et al.
2005/0146390 A1    7/2005    Baek
2005/0251777 A1    11/2005    Bartley et al.
2006/0055049 A1    3/2006    Nelson et al.
2006/0161874 A1*    7/2006    Harada et al. .................. 716/8
2006/0288317 A1*    12/2006    Hamada et al. .................. 716/5

FOREIGN PATENT DOCUMENTS

| CN | 1512283 A | 7/2004 |
|---|---|---|
| CN | 1836238 A | 9/2006 |
| CN | 1858750 A | 11/2006 |
| WO | 2004082180 A2 | 9/2004 |

* cited by examiner

*Primary Examiner*—Thuan Do
*Assistant Examiner*—Magid Y Dimyan
(74) *Attorney, Agent, or Firm*—Frank R. Niranjan

(57) ABSTRACT

A method for checking a length of a wire path between a capacitor and a via of the PCB design obtains length criteria and information on capacitors from a database, selects one or more capacitors and pins of the selected capacitors from the obtained information on capacitors and selects one of the length criteria, and obtains positions of selected capacitors and positions of vias corresponding to the positions of selected capacitors from the database. The method further calculates each length of a wire path between a selected capacitor and a corresponding via according to the position of the capacitor and the position of the via, determines whether each calculated length of a wire path between a selected capacitor and a corresponding via is acceptable according to a comparison with the selected length criterion, and outputs check results of the determining step.

6 Claims, 4 Drawing Sheets

Report

| Capacitor | Pins | length (mils) | Check result |
|---|---|---|---|
| C1.2 | GND_VDD | 70.000000 | Unacceptable |
| C1.1 | GND_VREF | 70.000000 | Unacceptable |
| C10.2 | GND_POWER | 52.800000 | Unacceptable |
| C10.1 | BCM_TXD | 113.313708 | Unacceptable |
| C100.2 | GND_VDDSPD | 45.930000 | Acceptable |
| C100.1 | 2D5V_5708 | 45.040000 | Acceptable |
| C1000.2 | 1D2V_5389 | 44.000000 | Acceptable |
| C1000.1 | 1D8V_STR | 42.000000 | Acceptable |
| C1001.2 | GND_POWER | 47.000000 | Acceptable |
| C1001.1 | 1D8V_STR | 39.000000 | Acceptable |
| C1002.2 | 3D3V_D400 | 39.000000 | Acceptable |
| . . . | . . . | . . . | . . . |

FIG. 4

SYSTEM AND METHOD FOR CHECKING A LENGTH OF A WIRE PATH BETWEEN A CAPACITOR AND A VIA OF A PCB DESIGN

BACKGROUND OF THE INVENTION

1. Field of the Invention

The present invention relates to a system and method for checking a length of a wire path between a capacitor and a via of a printed circuit board (PCB) design.

2. Description of Related Art

In electronics, PCBs are used to mechanically support and electronically connect electronic components using conductive pathways, traces, or etched copper sheets laminated onto a non-conductive substrate.

Some PCBs have multiple layers and are called multilayer PCBs. The multilayer PCBs are composed of between one and twenty-four conductive layers separated and supported by layers of insulating material (substrates) laminated (glued with heat, pressure or vacuum) together. Every two adjacent layers may be connected together through a drilled hole that is called a via.

The use of vias brings equivalent serial inductance (ESL), which leads to low-frequency power supply noise and high-frequency electromagnetic interference. The ESL is actually proportional to the area of an electric current loop (pin→capacitor→via→ground→pin). Hence, it is very important to control the area of the electric current loop, by means of checking a length of a wire path between a capacitor and a via of a PCB design. Obviously, it is generally difficult, laborious and time-consuming to check the length manually.

What is needed, therefore, is a system and method which can check a length of a wire path between a capacitor and a via of the PCB design, for the sake of reducing labor intensity and enhancing work efficiency.

SUMMARY OF THE INVENTION

A system for checking a length of a wire path between a capacitor and a via of a PCB design is disclosed. The system includes a host computer and a database. The database stores the PCB design, which includes information on capacitors and vias. The information on capacitors includes positions of the capacitors and pins of the capacitors. The information on vias includes positions of the vias corresponding to the positions of the capacitors. The host computer includes an obtaining module, a selecting module, a calculating module, a judging module, and an output module. The obtaining module is configured for obtaining length criteria and information on capacitors from the database. The selecting module is configured for selecting one or more capacitors and pins of selected capacitors from the obtained information on capacitors, and for selecting one of the length criteria. The obtaining module is further configured for obtaining positions of selected capacitors, and positions of vias corresponding to the positions of selected capacitors from the database. The calculating module is configured for calculating each length of a wire path between a selected capacitor and a corresponding via according to the position of the capacitor and the position of the via. The judging module is configured for determining whether each calculated length of a wire path between a selected capacitor and a corresponding via is acceptable according to a comparison with the selected length criterion. The output module is configured for outputting results of the judging module.

A method for checking a length of a wire path between a capacitor and a via of a PCB design is disclosed. The method includes: (a) obtaining length criteria and information on capacitors from a database; (b) selecting one or more capacitors and pins of selected capacitors from the obtained information on capacitors, and selecting one of the length criteria; (c) obtaining positions of selected capacitors, and positions of vias corresponding to the positions of selected capacitors from the database; (d) calculating each length of a wire path between a selected capacitor and a corresponding via according to the position of the capacitor and the position of the via; (e) determining whether each calculated length of a wire path between a selected capacitor and a corresponding via is acceptable according to a comparison with the selected length criterion; (f) outputting check results of the determining step.

Other advantages and novel features of the present invention will become more apparent from the following detailed description of preferred embodiment when taken in conjunction with the accompanying drawings, in which:

BRIEF DESCRIPTION OF THE DRAWINGS

FIG. 4 is an exemplary schematic illustration of results obtained by using the method of FIG. 3.

DETAILED DESCRIPTION OF THE INVENTION

Figure 1:
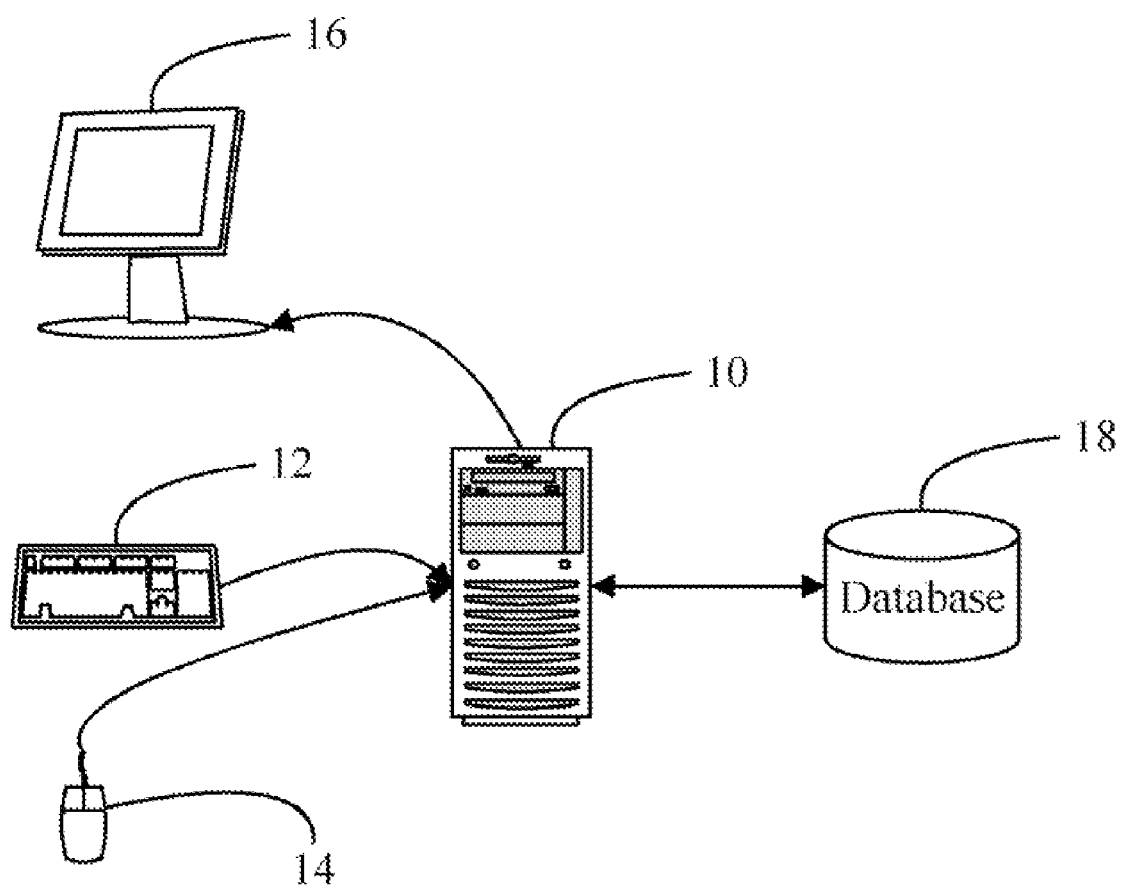
FIG. 1 is a schematic diagram of hardware configuration and an application environment of a system for checking a length of a wire path between a capacitor and a via of a PCB design in accordance with a preferred embodiment.

FIG. 1 is a schematic diagram of hardware configuration and an application environment of a system for checking a length of a wire path between a capacitor and a via of a PCB design (hereinafter "the system") in accordance with a preferred embodiment. The system typically includes one or more input devices (for example, a keyboard 12 and a mouse 14 herein), a display device 16, a host computer 10, and a database 18.

The database 18 is configured for storing a PCB design and length criteria. The PCB design includes information on capacitors and vias to be defined in a PCB. The information on capacitors includes positions of the capacitors and pins of the capacitors ('GND_VDD', 'GND_VREF', 'GND_POWER' for example). The information on vias includes positions of the vias, each of which corresponds to a position of a capacitor.

The input devices are configured for inputting and amending the PCB designs.

The display device 16 is configured for providing a graphical user interface (GUI) and displaying a result of checking a length of a wire path between a capacitor and a via of the PCB design.

The host computer 10 can be an IBM personal computer (PC), a network server, or any other type of computer.

Figure 2:
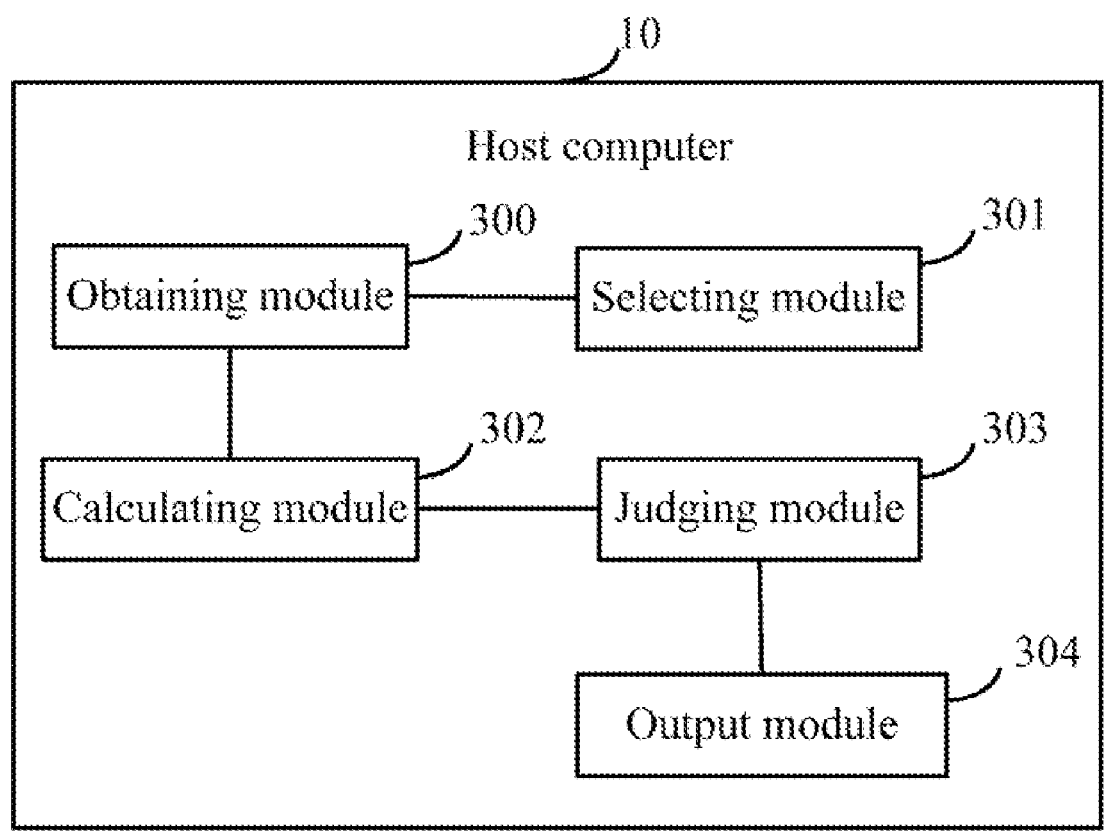
FIG. 2 is a schematic diagram of main function modules of the host computer of FIG. 1.

FIG. 2 is a schematic diagram of main function modules of the host computer 10. The host computer 10 may include an obtaining module 300, a selecting module 301, a calculating module 302, a judging module 303, and an output module 304.

The obtaining module 300 is configured for obtaining length criteria and information on capacitors from the database 18.

The selecting module 301 is configured for selecting one or more capacitors and pins of selected capacitors from the obtained information on capacitors. The selecting module 301 is further configured for selecting one of the length criteria. The length criterion is the maximum allowable length of a wire path between a capacitor and a via. In this preferred embodiment, the length criteria include 50 mils, 100 mils, 200 mils, 300 mils, and 500 mils.

The obtaining module 300 is also configured for obtaining one or more positions of selected capacitors from the database 18. The obtaining module 300 is further configured for obtaining one or more positions of vias that respectively corresponds to the positions of selected capacitors from the database 18.

The calculating module 302 is configured for calculating each length of a wire path between a selected capacitor and a corresponding via according to the position of the capacitor and the position of the via.

The judging module 303 is configured for determining whether each calculated length of a wire path between a selected capacitor and a corresponding via is acceptable according to a comparison with the selected length criterion. In detail, the judging module 303 compares each calculated length and the selected length criterion. If the calculated length is not greater than the selected length criterion, the length of a wire path between the capacitor and the corresponding via is acceptable. Otherwise, if the calculated length is greater than the selected length criterion, the length of a wire path between the capacitor and the corresponding via is unacceptable.

The output module 304 is configured for outputting check results of the judging module 303. Each check result is either acceptable or unacceptable herein. In this preferred embodiment, the output module 304 outputs the check results in the form of a report.

The judging module 303 is further configured for prompting users whether to continue checking the length.

Figure 3:
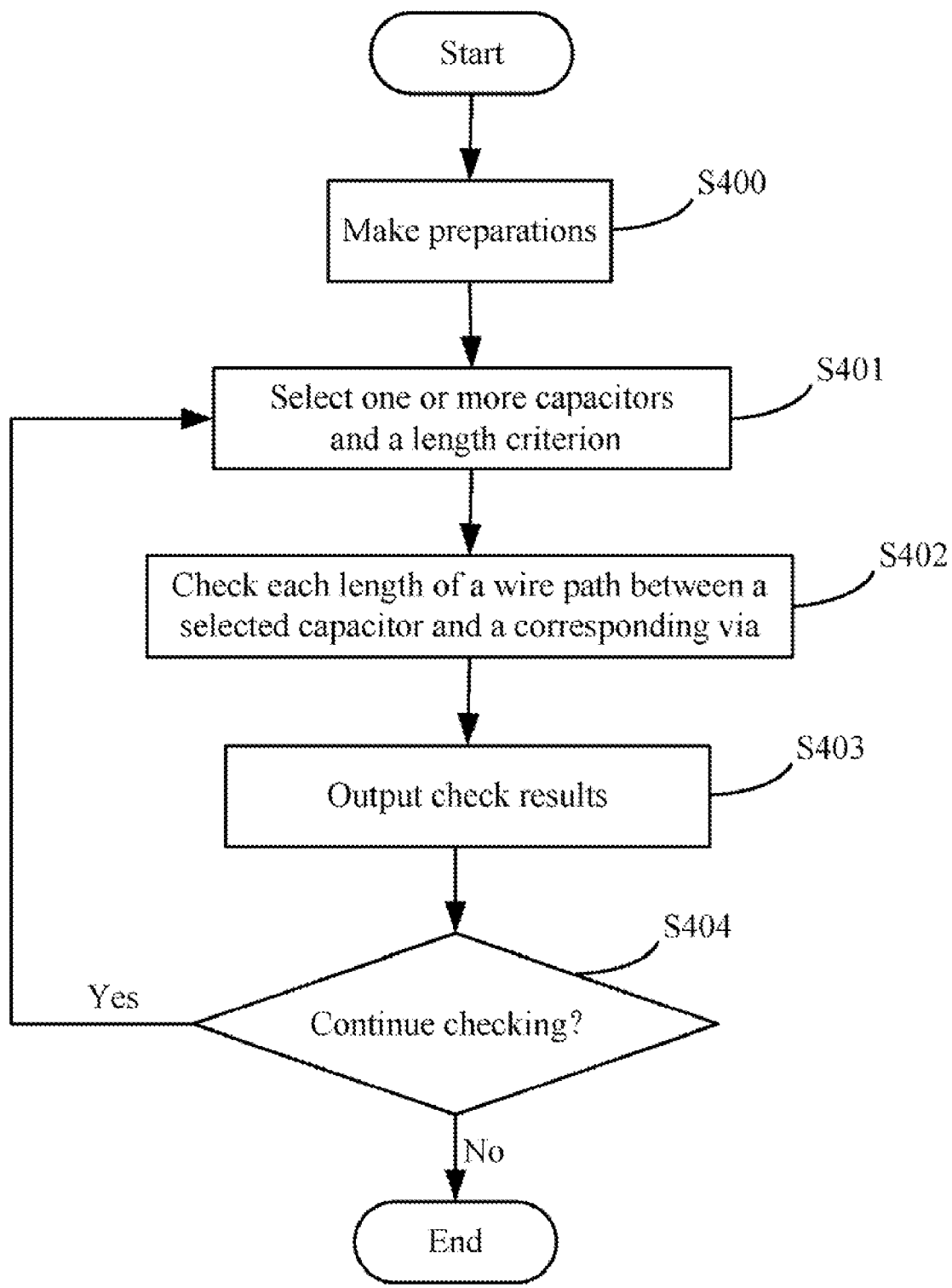
FIG. 3 is a flow chart of a preferred method for checking a length of a wire path between a capacitor and a via of a PCB design by utilizing the system of FIG. 1.

FIG. 3 is a flow chart illustrating a method for checking a length of a wire path between a capacitor and a via of a PCB design.

In step S400, the obtaining module 300 obtains length criteria and information on capacitors from the database 18.

In step S401, the selecting module 301 selects one or more capacitors and pins of the selected capacitors from the obtained information on capacitors. Then, the selecting module 301 selects one of the length criteria. The length criterion is the maximum allowable length of a wire path between a capacitor and a via. In this preferred embodiment, the length criteria include 50 mils, 100 mils, 200 mils, 300 mils, and 500 mils.

In step S402, the obtaining module 300 obtains one or more positions of selected capacitors from the database 18. Then, the obtaining module 300 obtains one or more positions of vias that respectively corresponds to the positions of selected capacitors from the database 18. The calculating module 302 calculates each length of a wire path between a selected capacitor and a corresponding via, according to the position of the capacitor and the position of the via. The judging module 303 determines whether each calculated length of a wire path between a selected capacitor and a corresponding via is acceptable according to a comparison with the selected length criterion. In detail, the judging module 303 compares each calculated length and the selected length criterion. If the calculated length is not greater than the selected length criterion, the length of a wire path between the capacitor and the corresponding via is acceptable. Otherwise, if the calculated length is greater than the selected length criterion, the length of a wire path between the capacitor and the corresponding via is unacceptable.

In step S403, the output module 304 outputs check results of the determining step. Each check result is either acceptable or unacceptable herein. In this preferred embodiment, the output module 304 outputs the check results in the form of a report (referring to FIG. 4).

In step S404, the judging module 303 prompts users whether to continue checking the length. If the users determine to continue checking, the procedure returns to step S401. Otherwise, if the users determine not to continue checking, the procedure ends.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A system for checking a length of a wire path between a capacitor and a via of a PCB design, the system comprising a host computer and a database, the database storing length criteria and the PCB design which comprises information on capacitors and information on vias, wherein: the information on capacitors comprises pins of the capacitors and positions of the capacitors, the information on vias comprises positions of the vias, and each of the positions of the vias corresponds to a position of a capacitor, and wherein the host computer comprises:

an obtaining module configured for obtaining length criteria and information on capacitors from the database;

a selecting module configured for selecting one or more capacitors and pins of selected capacitors from the obtained information on capacitors, and for selecting one length criterion from the length criteria;

the obtaining module further configured for obtaining positions of the selected one or more capacitors, and positions of vias corresponding to the positions of the selected one or more capacitors from the database;

a calculating module configured for calculating a length of a wire path between a selected capacitor and a corresponding via according to the position of the capacitor and the position of the via;

a judging module configured for comparing each calculated length and a corresponding selected length criterion, and determining whether the calculated length is acceptable according to a comparison result; and an output module configured for outputting all comparison results.

2. The system according to claim 1, wherein the judging module is further configured for prompting users whether to continue checking lengths of remaining wire paths.

3. The system according to claim 1, wherein the selected one length criterion is the maximum allowable length of a wire path between a capacitor and a via.

4. A computer-based method for checking a length of a wire path between a capacitor and a via of a PCB design, the method comprising:

obtaining length criteria and information on capacitors from a database, wherein the information on capacitors comprises pins of the capacitors and positions of the capacitors;

selecting one or more capacitors and pins of the selected one or more capacitors from the obtained information on capacitors, and selecting one length criterion from the length criteria;

obtaining positions of the selected one or more capacitors, and positions of vias corresponding to the positions of the selected one or more capacitors from the database;

calculating a length of a wire path between a selected capacitor and a corresponding via according to the position of the capacitor and the position of the via;

comparing each calculated length and a corresponding selected length criterion, and determining whether the calculated length is acceptable according to a comparison result; and outputting all comparison results.

5. The method according to claim 4, further comprising:

prompting users whether to continue checking the lengths of remaining wire paths.

6. The method according to claim 4, wherein the selected one length criterion is the maximum allowable length of a wire path between a capacitor and a via.

\* \* \* \* \*